United States Patent
Shimizu et al.

(10) Patent No.: US 6,767,641 B1
(45) Date of Patent: Jul. 27, 2004

(54) METHOD FOR SEALING FINE GROOVE WITH SILICEOUS MATERIAL AND SUBSTRATE HAVING SILICEOUS COATING FORMED THEREON

(75) Inventors: Yasuo Shimizu, Kokubunji (JP); Yuuji Tashiro, Saitama (JP); Tomoko Aoki, Kakegawa (JP)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 10/258,285

(22) PCT Filed: Jun. 20, 2000

(86) PCT No.: PCT/JP00/04020

§ 371 (c)(1),
(2), (4) Date: Oct. 23, 2002

(87) PCT Pub. No.: WO01/82357

PCT Pub. Date: Nov. 1, 2001

(30) Foreign Application Priority Data

Apr. 25, 2000  (JP) .................................. 2000-128988

(51) Int. Cl.⁷ ............................. B32B 9/00; B05D 3/02
(52) U.S. Cl. ...................... 428/446; 428/131; 428/134; 428/212; 428/220; 427/377; 427/387; 427/397.7
(58) Field of Search ................................ 428/446, 131, 428/134, 220, 212; 427/372.2, 377, 384, 387, 397.7

(56) References Cited

U.S. PATENT DOCUMENTS

| 5,747,623 A | 5/1998 | Matsuo et al. |
| 5,922,411 A | 7/1999 | Shimizu et al. |
| 6,191,002 B1 * | 2/2001 | Koyanagi .................... 438/431 |

FOREIGN PATENT DOCUMENTS

| JP | 01223742 A | * | 9/1989 | ........... H01L/21/76 |
| JP | 05243212 A | * | 9/1993 | ......... H01L/21/316 |
| JP | 08008248 A | * | 1/1996 | ....... H01L/21/3205 |
| JP | 09-275135 A | | 10/1997 | |
| JP | 11-145286 A | | 5/1999 | |
| JP | 11-307626 A | | 11/1999 | |
| JP | 11307626 A | * | 11/1999 | ........... H01L/21/76 |

* cited by examiner

*Primary Examiner*—Stephen Stein
(74) *Attorney, Agent, or Firm*—Alan P. Kass

(57) ABSTRACT

A method for sealing a fine groove with a siliceous material, characterized as comprising applying a solution of a perhydropolysilazane having a weight average molecular weight in the range of 3,000 to 20,000 in terms of polystyrene to a substrate having at least one groove having a width of 0.2 $\mu$m or less at its deepest portion and having a ratio of the corresponding depth to the width of 2 or more, to thereby fill and seal the groove with the perhydropolysilazane, and then heating the perhydropolysilazane in an atmosphere containing water vapor to thereby convert the perhydropolysilazane to a siliceous material.

15 Claims, 2 Drawing Sheets

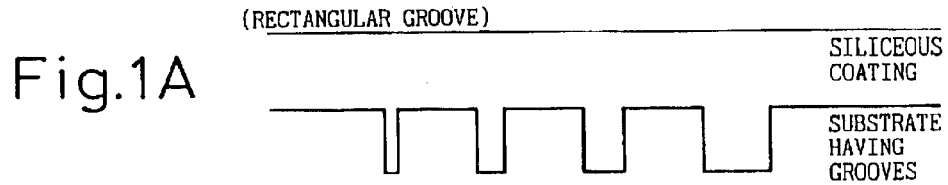
Fig.1A (RECTANGULAR GROOVE)
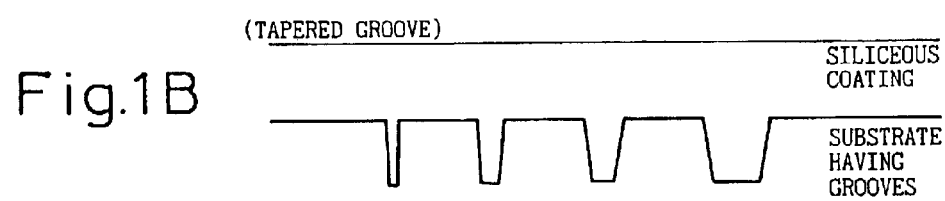
Fig.1B (TAPERED GROOVE)
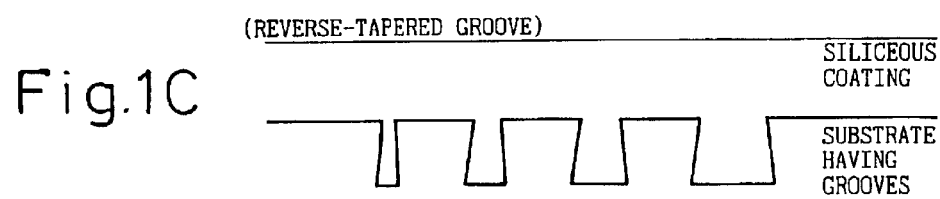
Fig.1C (REVERSE-TAPERED GROOVE)
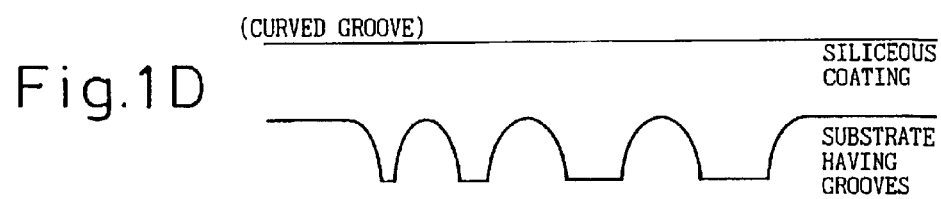
Fig.1D (CURVED GROOVE)

METHOD FOR SEALING FINE GROOVE WITH SILICEOUS MATERIAL AND SUBSTRATE HAVING SILICEOUS COATING FORMED THEREON

TECHNICAL FIELD

The present invention relates to a method for uniformly sealing grooves, in a substrate having fine grooves for use in electronic devices such as semiconductor devices, with a siliceous material, and to a substrate, having a siliceous coating formed thereon, obtained by said method.

BACKGROUND ART

The production of electronic devices such as semiconductor devices involves such steps as the formation of insulating coatings between transistor elements and bit lines, between transistor elements and capacitors, between bit lines and capacitors, or capacitors and metal wirings, the formation of insulating coatings between metal wirings termed Inter-Metal Dielectrics (IMDs), or the sealing of isolation grooves. In such formations and sealings, siliceous materials are generally used, and methods of formation thereof include CVD methods, sol-gel methods, siloxane polymer solution-coating methods etc.

Due to increasingly higher integration of electronic devices, grooves on the substrate are becoming more fine. When such fine grooves are sealed using conventional methods, the following problems arise.

There is a problem that when fine grooves having a groove width of 0.2 $\mu$m or less and a ratio (hereinafter referred to as "aspect ratio") of the corresponding depth to the width of 2 or more are sealed with a siliceous material, voids tend to be generated in the inside of the grooves due to conformal nature inherent in the CVD method. As a means to inhibit the generation of such voids, there is a method (the HDP-CVD method) of forming coatings by increasing the etching rate using a high-density plasma, but there are problems with the method that the upper shoulder regions of the grooves in a substrate can also be etched by the method, deforming the shape of the grooves, the coating-forming speed can be reduced, and others.

As methods of resolving such problems inherent to the CVD method, there are sol-gel methods or siloxane polymer solution-coating methods in which a sol-gel solution or a siloxane polymer solution is applied onto a substrate having fine grooves, which is then dried to seal the fine grooves, then heated to be converted into a siliceous material. However, during heating, sol-gel solutions and siloxane polymers are generally accompanied by dehydration or dealcoholization condensation, so that there occurs a considerable shrinkage in volume during the conversion into siliceous materials. Thus, there arises a problem that when fine grooves having a groove width of 0.2 $\mu$m or less and an aspect ratio of 2 or more are sealed with a siliceous material, the density of the siliceous material in the inside of the fine grooves markedly decreases more than the density of the area around the surface on the outside of the grooves due to constraint on the wall surface of grooves. Thus, in the sol-gel methods or the siloxane polymer solution-coating methods, it is difficult to seal fine grooves so as to obtain a uniform density from the coating surface to the bottom of the fine grooves.

As a method that permits conversion into a siliceous material without concomitant condensation reactions, there is a method in which a polysiloxane solution is applied and dried to seal fine grooves, and then is heated. However, since polysilazanes containing organic groups such as hydrocarbon groups and alkoxy groups undergo decomposition of the organic groups, there occurs a shrinkage in volume during conversion into a siliceous material. Thus, there is a problem that when fine grooves having a groove width of 0.2 $\mu$m or less and an aspect ratio of 2 or more are sealed with a siliceous material by a method that uses an organic group-containing polysilazane, the density of the siliceous material in the inside of the fine grooves markedly decreases due to a constraint on the wall surface of grooves, as in the above-mentioned sol-gel method, more than the density of the area around the surface on the outside of the grooves. Polysilazanes having an average molecular weight greater than a specific value, even when they do not contain organic groups, tend to exhibit a considerable shrinkage in volume during conversion into a siliceous material, and similar problems will arise.

Polysilazanes that do not contain organic groups and that have an average molecular weight greater than a specific value tend to exhibit reduced sealability to fine grooves during application, and tend to generate voids etc. in the inside of fine grooves as in the CVD method.

When the density of a siliceous material in the fine groove is not uniform, formation of penetrating holes in the subsequent step of through hole formation becomes difficult, and variation in the characteristics as an insulating material occurs. Such nonuniformity in density poses a problem among a plurality of fine grooves having different widths, as well as between the inside and the outside of fine grooves, because generally the finer the grooves are, the lower the density becomes, due to larger affect from the wall surface of grooves. Considering that grooves in a substrate will become even finer due to much higher integration of electronic devices in the future, there is a need for methods that can attain uniform sealing of such grooves, regardless of the inside or outside, and width, of the grooves. Thus, it is an object of the present invention to provide a method that permits uniform sealing of fine grooves with a siliceous material which was difficult in the conventional methods mentioned above.

DISCLOSURE OF THE INVENTION

In order to attain the above objective, the present invention intends to provide a method for sealing a fine groove with a siliceous material, characterized as comprising applying a solution of a perhydropolysilazane having a weight average molecular weight in the range of 3,000 to 20,000 in terms of polystyrene to a substrate having at least one groove having a width of 0.2 $\mu$m or less at its deepest portion and having a ratio of the corresponding depth to the width of 2 or more, to thereby fill and seal the groove with the perhydropolysilazane, and then heating the perhydropolysilazane in an atmosphere containing water vapor to thereby convert the perhydropolysilazane to a siliceous material.

Furthermore, the present invention intends to provide a substrate having siliceous coating formed thereon comprising a substrate containing at least one groove having a width of 0.2 $\mu$m or less at its deepest portion and having the ratio of the corresponding depth to the width of 2 or more and a siliceous coating formed thereon to fill and seal said groove, wherein said siliceous material coating is substantially free of voids in the inside of the groove, and the etching rate of said groove at its deepest portion is three times or less the etching rate on the surface of said siliceous material coating.

BRIEF EXPLANATION OF THE DRAWINGS

FIGS. 1A–1D are schematic longitudinal cross sections of a groove having a shape to which the present invention can be applied.

BEST MODE FOR CARRYING OUT THE INVENTION

Figure 2:
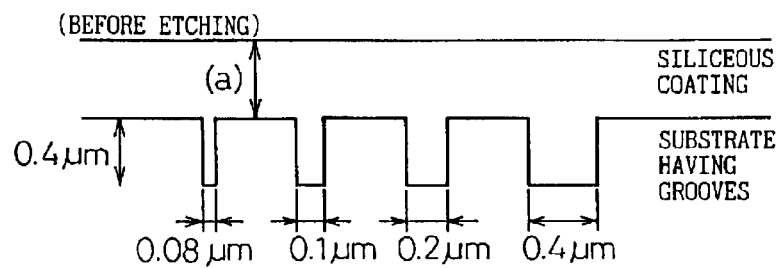
FIG. 2 is a schematic longitudinal cross section of a substrate having a siliceous coating formed thereon for explaining the method of determining etching rates of the present invention.

In accordance with the method of the present invention, there is used a solution of perhydropolysilazane having a weight average molecular weight in the range of 3,000 to 20,000 in terms of polystyrene. As used herein, perhydropolysilazane refers to a polymer in which all elements bound to Si and N are H except the Si—N bond. The simplest structure of perhydropolysilazane is a chained structure having the following repeat units:

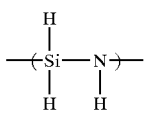

In accordance with the present invention, there can be used perhydropolysilazanes having a chain structure and a ring structure within the molecule. For example, there can be mentioned a perhydropolysilazane having chain portions and ring portions within the molecule, which is reported, for example, in Japanese Examined Patent Publication (Kokoku) No. 63-16325 to Isoda et al.; D. Seyferth et al., Communication of Am. Cer. Soc., C-13, January 1983, and the like, and is represented by the following general formula:

As a specific embodiment of a perhydropolysilazane represented by the above general formula, there can be mentioned those having a partial structure as follows:

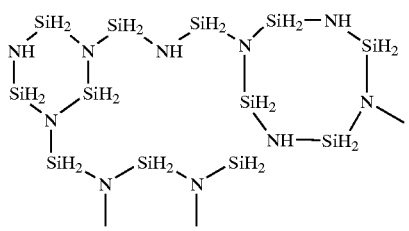

Such a perhydropolysilazane may be generally synthesized by reacting a dihalosilane and a base to form an adduct of dihalosilane, and then by reacting said adduct with ammonia. Methods of synthesizing perhydropolysilazanes are known, and are described in detail in the above Japanese Examined Patent Publication (Kokoku) No. 63-136325, Japanese Unexamined Patent Publication (Kokai) No. 1-138107, Japanese Unexamined Patent Publication (Kokai) No. 1-138108, Japanese Unexamined Patent Publication (Kokai) No. 3-170533, and other publications.

Perhydropolysilazanes of the present invention have a weight average molecular weight in the range of 3,000 to 20,000 in terms of polystyrene. Methods of determining a weight average molecular weight in terms of polystyrene are known, and can generally be determined by gel permeation chromatography (GPC). In cases where the weight average molecular weight of perhydropolysilazane in terms of polystyrene is less than 3,000, small molecules that scatter (evaporate) on heating for conversion into a siliceous material increase, which may lead to volume shrinkage and even to a significant low density within fine grooves, which are not negligible. Therefore, the lower limit of weight average molecular weight of perhydropolysilazane in terms of polystyrene of the present invention is 3,000, preferably 4,000, and more preferably 5,000. On the contrary, in cases where the weight average molecular weight of perhydropolysilazane in terms of polystyrene exceeds 20,000, the viscosity of solutions applied become higher and, hence, the curing rate during application becomes high, and, therefore, the permeability of the solution into fine grooves becomes low. Therefore, the upper limit of the weight average molecular weight of perhydropolysilazane in terms of polystyrene is 20,000, preferably 15,000, and more preferably 10,000.

Perhydropolysilazanes of the present invention may be coated on the substrate as a solution. As solvents for use in the coating solution, there can be mentioned, but not limited to, aromatic compounds such as benzene, toluene, xylene, ethylbenzene, diethylbenzene, trimethylbenzene and triethylbenzene; cyclohexane; cyclohexene; decahydronaphthalene; dipentene; saturated hydrocarbons such as n-pentane, i-pentane, n-hexane, i-hexane, n-heptane, i-heptane, n-octane, i-octane, n-nonane, i-nonane and n-decane; ethylcyclohexane; methylcyclohexane; cyclohexane; cyclohexene; p-mentane; ethers such as dipropylether, dibutylether and anisole; esters such as n-butyl acetate, i-butyl acetate, n-amyl acetate and i-amyl acetate; ketones such as methylisobutylketone (MIBK). By using a plurality of solvents, the solubility of a perhydropolysilazane or the evaporation rate of solvents can be controlled.

The amount of a solvent used can be selected to facilitate workability by the application method used, and can be selected, as appropriate, depending on the average molecular weight, distribution and structure of the perhydropolysilazane used, considering a permeability of the solution into the fine grooves and a film thickness required in the outside of the grooves. The perhydropolysilazane of the present invention can be used at an amount in the range of 0.1 to 70% by weight, preferably 1 to 30% by weight in the application solution.

In accordance with the present invention, a perhydropolysilazane solution thus prepared is coated on a substrate having at least one groove having a width of 0.2 $\mu$m or less at its deepest portion and an aspect ratio of 2 or more. The shape of fine grooves is not specifically limited, and there can be used rectangular grooves, tapered grooves, reverse-tapered grooves, curved grooves and the like in the present invention, as shown in FIGS. 1A to 1D. Furthermore, both ends of fine grooves may be open or closed.

In conventional methods, even when attempting to seal a fine groove, having a width of 0.2 $\mu$m or less at its deepest portion and an aspect ratio of 2 or more, with a siliceous material, it was impossible to seal the groove so as to be uniform, both inside and outside of thereof, because considerable volume shrinkage during conversion into a siliceous material led to lower density in the inside of the groove than on the outside thereof. According to the present invention, when a substrate having such fine grooves is used, the effect becomes manifest that the density in the inside of the groove becoming lower relative to the outside of the siliceous material can be inhibited. Such an effect of the present invention becomes more evident in cases where substrates having very fine grooves having a width of 0.1 μm or less, and furthermore 0.08 μm at its the deepest portions, and an aspect ratio of 4 or more, and furthermore 5 or more, are used.

As used herein, the term "sealing" is used to mean an aspect in which grooves are filled up and, at the same time, coating is formed on the surface of the grooves (by adjusting, as appropriate, the concentration of the perhydropolysilazane in the coating solution depending on the structure of the groove), as shown in FIGS. 1A to 1D, and also an aspect in which only grooves are filled up.

As a representative example of a substrate with at least one groove having a width of 0.2 μm or less at its the deepest portions and an aspect ratio of 2 or more, there can be mentioned substrates for electronic devices equipped with transistor elements, bit lines, capacitors and the like. In the production of such electronic devices, such steps as the formation of insulating coatings between transistor elements and bit lines, between transistor elements and capacitors, between bit lines and capacitors, or capacitors and metal wirings, the formation of insulating coatings between metal wirings termed IMD, or the sealing of isolation grooves may be followed by a step of forming holes (through holes) that penetrate the sealing material in the fine grooves. The step of forming through holes usually comprises a lithography step by coating, exposure and development of resists, separation of the resists by dry etching with a CF gas, and $O_2$ plasma etc., and the subsequent step of washing dry etching debris or resist debris by immersion in an HF or amine solution. In the above-mentioned CVD methods or sol-gel methods, or siloxane polymer solution-coating methods, the density of siliceous material in the inside of fine grooves becomes lower than on the outside of the grooves or nonuniform, and subsequently problems may occur, during the formation of through holes, that the dry etching rate in the inside of the grooves or etching rate by a washing solution becomes much faster than that on the outside of the grooves, and hence through holes may be deformed, resulting in poor conduction between wirings. As the main conventional method for forming PMD, BPSG coating may be mentioned. In this method, transistor elements and bit lines are processed on a silicon substrate and then an $SiO_2$ coating containing boron (B) and phosphorus (P) is formed by a CVD method, and then heated at 800 to 900° C. to be molten and render the rough elements flat. However, the method of the present invention is more advantageous than the BPSG method in that it does not require the use of a large-scale CVD equipment, and that a high-purity silica coating can be obtained at a relatively low temperature, as described below.

In the application to an isolation groove, unlike the application to the above-mentioned PMD or IMD, there is no step of forming through holes after sealing, but polishing by Chemical Mechanical Polishing (CMP) is generally carried out to remove only the insulating coating on the outside of the grooves. When the density of siliceous material in the inside of fine grooves is low or nonuniform relative to that on the outside of the grooves, problems may arise such as failure to obtain a smoothly polished surface or failure to obtain good isolation (element separation) characteristics due to cracks formed between the groove and the siliceous material coating.

The present invention is suitable for use on substrates having at least one groove having a width of 0.2 μm or less at its deepest portion, and an aspect ratio of 2 or more, in any application that requires the uniform sealing of a siliceous material in the inside and on the outside of the groove. Such uses include, for example, undercoating (passivation coating such as Na) for liquid crystal glasses, overcoating (insulating smoothing coating) for liquid crystal color filters, gas barriers for film liquid crystals; hard coating for substrates (metal, glass), heat resistant and anti-oxidation coating, antifouling coating, water-repellent coating, hydrophilic coating; UV-cut coating for glasses and plastics, colored coating, and the like.

Methods of coating perhydropolysilazane solutions to such substrates are not specifically limited, and there can be mentioned, for example, spin coating, immersion, spraying, transferring and the like.

After the application of a perhydropolysilazane solution, for the purpose of drying or pre-curing a coating, a drying process is carried out in the ambient atmosphere, an inert gas or an oxygen gas at a temperature of 50 to 400° C. for 10 seconds to 30 minutes. By the drying, the solvent is removed and the fine grooves are substantially sealed with perhydropolysilazane.

In accordance with the present invention, perhydropolysilazane contained in the inside and on the outside of the fine grooves is converted into a siliceous material by heating in an atmosphere containing water vapor.

An atmosphere containing water vapor refers to an atmosphere in which the partial pressure of water vapor is in the range of 0.5 to 101 kPa, preferably 1 to 90 kPa, and more preferably 1.5 to 80 kPa. Heating may be carried out at a temperature in the range of 400 to 1200° C.

When heating is carried out at a high temperature such as a temperature exceeding 600° C. in an atmosphere containing water vapor, there is a risk that it may badly affect other elements such as electronic devices, if any, that are simultaneously subjected to the heating treatment. In such cases, the silica conversion process may be divided into two or more steps, in which heating may be carried out initially at a relatively low temperature such as a temperature in the range of 400 to 600° C. in an atmosphere containing water vapor, and then at a higher temperature such as a temperature in the range of 500 to 1200° C. in an atmosphere containing no water vapor.

As components (hereinafter referred to as dilution gases) other than the water vapor in an atmosphere containing water vapor, any gas may be used and illustrative examples include air, oxygen, nitrogen, helium, argon, and the like. Considering the quality of the siliceous material obtained, oxygen is preferably used as the dilution gas. However, a dilution gas is also selected as appropriate considering the effect to other elements such as electronic devices which are subjected to said heating treatment. Also, as an atmosphere containing no water vapor in the above-mentioned two-step heating strategy, in addition to an atmosphere containing any of the above dilution gases, an atmosphere with a reduced pressure of 1.0 kPa or less or a vacuum may be used.

Examples of preferred heating conditions established considering the above include the following:

(1) A perhydropolysilazane solution according to the present invention is coated on a given substrate, dried, and then heated in an atmosphere at a temperature in the range of 400 to 600° C. and a water vapor partial pressure in the range of 0.5 to 101 kPa, followed by heating in an atmosphere at a temperature in the range of 500 to 1200° C. and an oxygen partial pressure in the range of 0.5 to 101 kPa;

(2) A perhydropolysilazane solution according to the present invention is coated on a given substrate, dried, and then heated in an atmosphere at a temperature in the range of 400 to 600° C. and a water vapor partial pressure in the range of 0.5 to 101 kPa, followed by heating in an atmosphere of one or more of inert gas selected from nitrogen, helium, and argon at a temperature in the range of 500 to 1200° C.; and (3) A perhydropolysilazane solution according to the present invention is coated on a given substrate, dried, and then heated in an atmosphere at a temperature in the range of 400 to 600° C. and a water vapor partial pressure in the range of 0.5 to 101 kPa, followed by heating in an atmosphere with a reduced pressure of less than 1.0 kPa or a vacuum atmosphere at a temperature in the range of 500 to 1200° C.

Rates of temperature rise or temperature reduction to the desired temperature in heating are not specifically limited, and may generally be in the range of 1° C. to 100° C./min. The duration of retention of the temperature after the desired temperature has been attained is not specifically limited, either, and may generally be in the range of 1 minute to 10 hours.

In the above heating process, perhydropolysilazane undergoes a hydrolysis reaction with water vapor, and is then converted into a siliceous material mainly containing Si—O bonds. Since this conversion reaction is not accompanied by a condensation reaction such as a dehydrogenation reaction or by the decomposition of organic groups, volume changes before and after the reaction is very small. Thus, when fine grooves having a width of 0.2 $\mu$m or less and an aspect ratio of 2 or more are sealed with a siliceous material according to the invention, the effect that the density of a siliceous material becomes further lower, due to a constraint from the wall surfaces of the grooves, is very small and, therefore, fine grooves can be more uniformly sealed regardless of the inside or outside of the grooves or the width thereof. Furthermore, since there is no conformal nature in the method of the present invention unlike the CVD method, there is no generation of voids or vacancies in the inside of the fine grooves. Furthermore, as volume shrinkage during silica conversion is small in the method of the present invention, no cracks appear even when the thickness of coating is 0.5 $\mu$m or more.

Thus, substrates having siliceous coatings formed thereon in which fine grooves are relatively homogeneously sealed are newly provided. In accordance with the present invention, there is provided a substrate having siliceous coating formed thereon comprising a substrate containing at least one groove having a width of 0.2 $\mu$m or less at its most deep portion and having the ratio of the corresponding depth to the width of 2 or more and a siliceous coating formed thereon to fill and seal said groove, wherein said siliceous material coating is substantially free of voids in the inside of the groove, and the etching rate of said groove at its deepest portion is three times or less the etching rate on the surface of said siliceous material coating.

As mentioned above, as the siliceous material coating of the present invention is obtained by hydrolysis of perhydropolysilazane, it contains mainly Si—O bonds, but it also contains some Si—N bonds depending on the degree of conversion. Therefore, that a siliceous material contains Si—N bonds indicates that the material is derived from polysilazane. Specifically, the siliceous material coating of the present invention contains nitrogen in the range of 0.005 to 5% in terms of atomic percentage depending on the degree of conversion. In fact, it is difficult to reduce this nitrogen content to lower than 0.005%. The percentage of nitrogen can be determined by atomic absorption.

The siliceous material coating of the present invention is substantially free of voids in the inside of fine grooves. "void" as used herein generally means a cavity in the siliceous material and a typical void is intended to mean a spherical cavity having a diameter of about 0.01 $\mu$m or more. "Void" is not intended to mean a specific shape but may generally take an irregular shape. As used herein, states in which such voids are extended in succession to some degree are called "cavitated."

In the conventional CVD method, due to the conformal nature inherent to the CVD method, it is essentially difficult to seal a fine groove having a width of 0.2 $\mu$m or less and an aspect ratio of 2 or more with a siliceous material without generating such voids, and the siliceous material obtained by the CVD method becomes discontinuous in the inside of the fine grooves. The siliceous material coating of the present invention may be obtained by applying a highly fluid perhydropolysilazane solution to a substrate, and thereby no voids due to the conformal nature are generated, and the siliceous material within the fine grooves becomes continuous.

In the siliceous material coating of the present invention, the etching rate at the deepest portion of the grooves is three times or less that on the surface of the siliceous material coating. An etching rate, as is known, is a measured value for quantitating the density of a material. The smaller the etching rate of a material is, the higher the density of the material is. For a given material, the smaller the difference in the etching rates is, the smaller the difference in density is. That the etching rate at the deepest portion of a groove is three times or less that on the surface of the siliceous material coating indicates that, in the siliceous material coating of the present invention, there is no difference exceeding three times between the density of the deepest part of the groove and the surface of the siliceous material coating. In the siliceous material coating of the present invention, the etching rate at the deepest portion of a groove is preferably twice or less, more preferably 1.6 times or less the etching rate on the surface of the siliceous material coating.

In the conventional sol-gel method or the siloxane polymer solution-application method, or methods using an organic group-containing polysilazane, considerable volume shrinkage occurs during conversion into a siliceous material and, thus, when these methods are used to seal a siliceous material having a width of 0.2 $\mu$m or less and an aspect ratio of 2 or more, the density of the siliceous material in the inside of the fine groove becomes nonuniform. The siliceous material coating of the present invention has very little shrinkage in volume during conversion into a siliceous material, and the siliceous material becomes more uniform between the inside and the outside of the groove.

Among a plurality of fine grooves having different groove widths, when volume shrinkage occurs during conversion into a siliceous material, the finer the groove is, the greater the constraint by the wall surface of the groove becomes, and the density of the siliceous material in the inside of the groove becomes essentially lower. As the siliceous material coating of the present invention has very little shrinkage in volume during conversion into a siliceous material, density becomes uniform even among a plurality of fine grooves having different groove widths.

The thickness of coating formed on the surface of the outside of grooves is not specifically limited, and generally it may be any thickness in the range that does not cause any cracks in the coating during conversion into a siliceous material. As mentioned above, according to the present invention, no cracks appear even when the thickness of coating is 0.5 μm or more, and thus a coating of at least 0.5 μm in thickness can be formed on the surface of the outside of the groove.

The present invention will be explained in more detail hereinbelow.

Method of Determining Etching Rates

The etching rate (inside of a groove) at its deepest portion and the etching rate on the surface (outside of a groove) of the coating were determined as follows:

A polymer (40 g) to be evaluated was weighed out and dissolved in 120 g of xylene, which was filtered with a PTFE filter with filter precision of 0.1 μm. Two ml of the polymer obtained was added dropwise on a silicon wafer (substrate) with a diameter of 101.6 mm (4 inches) which has grooves with a rectangular shape in a longitudinal section, of which surface is covered with a $Si_3N_4$ thin film with a thickness of 0.05 μm, which have a fixed depth of 0.4 μm, and which have a width of 0.08 μm, 0.1 μm, 0.2 μm, and 0.4 μm (the aspect ratio becomes 5.0, 4.0, 2.0, and 1.0, respectively), and then spin coated at a condition of 2,000 rpm and a retention time of 20 seconds. Then, after drying on a 150° C. hot plate for three minutes, the substrate was heated in each of the methods described below to form a siliceous material coating.

The substrate having siliceous coating formed thereon thus obtained was cut in a direction orthogonal to the longitudinal direction of the groove, and the groove part of the cross section was examined with a scanning electron microscope (SEM) model S-5,000 of Hitachi Ltd. at a magnification of 150,000 from a direction perpendicular to the cross-section to determine the length (a) before etching as shown in FIG. 2.

Figure 3:
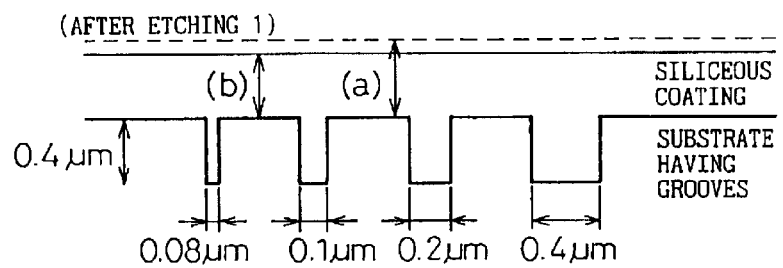
FIG. 3 is a schematic longitudinal cross section of a substrate having a siliceous coating formed thereon for explaining the method of determining etching rates of the present invention.
Figure 4:
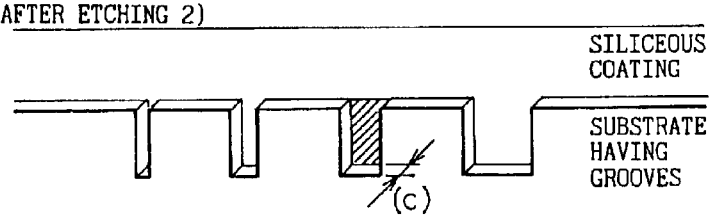
FIG. 4 is a schematic perspective view of a substrate having a siliceous coating formed thereon for explaining the method of determining etching rates of the present invention.

Then, the substrate having siliceous coating formed thereon that was cut at a direction orthogonal to the longitudinal direction of the groove was immersed in an aqueous solution containing 0.5% by weight of hydrofluoric acid and 40% by weight of ammonium fluoride at 20° C. for 1 minute, and then washed well with pure water and dried. Then, the groove part of the cross section was similarly examined with the above SEM at a magnification of 150,000 from a direction perpendicular to the cross-section to determine the length (b) after etching as shown in FIG. 3. Then the groove part of the cross section was examined with the above SEM at a magnification of 300,000 from an angle of elevation of 40 degrees to the direction perpendicular to the cross-section, and photographs were taken, and from the length on the photograph, the length (c) after etching as shown in FIG. 4 was calculated by the triangular method.

Since the length (c) after etching of the deepest part of the groove varies with the width of the groove (aspect ratio), determination was made on each groove of four widths.

Using a–c thus obtained, the etching rate (A) in the inside of the groove and the etching rate (B) on the outside of the groove were determined as follows:

A=c

B=a-b

The state of the interface (the diagonally shaded area in FIG. 4) of the inside of the groove after etching was visually examined for the above SEM photograph, and was classified into the smooth, voided, or cavitated. As the state of the etched interface varies with the depth of the groove (aspect ratio), determination was made on each groove of four widths.

COMPARATIVE EXAMPLE 1

Using the above method, a methylsiloxane polymer having a weight average molecular weight of 5,000 in terms of polystyrene was coated on the above substrate, and dried. The coating was heated in an oxygen atmosphere (oxygen partial pressure 96 kPa) at a temperature of 800° C. and a water vapor partial pressure of 5 kPa for 1 hour. Determination of etching rate was attempted in the above method, but it was impossible because the inside of all the grooves was cavitated for all aspect ratios.

COMPARATIVE EXAMPLE 2

Using the above method, a hydrogenated silsesquioxane polymer having a weight average molecular weight of 5,000 in terms of polystyrene was coated on the above substrate, and dried. The coating was heated in an atmosphere (oxygen partial pressure 96 kPa) at a temperature of 800° C. and a water vapor partial pressure of 5 kPa for 1 hour. Determination of etching rate was attempted in the above method, but it was impossible because nonuniform voids were formed in the inside of the grooves with an aspect ratio of 2 or more. For the grooves with an aspect ratio of 1, the etching rate (A) in the inside of the grooves was 8.5 times greater than that (B) in the outside of the grooves. The state of the etched surface of the grooves with an aspect ratio of 1 was smooth.

COMPARATIVE EXAMPLE 3

A four-necked flask with an internal volume of 2 L was equipped with a gas feeding pipe, a mechanical stirrer, and a Dewar condenser. After the content of the reactor was replaced with dry nitrogen, 1,500 ml of dry pyridine was placed in the four-necked flask, which was incubated in an oil bath at 40° C. Then, 100 g of methylhydrodichlorosilane was slowly added therein. While cooling with ice and stirring the reaction mixture, 70 g of ammonia was slowly blown therein. Then dry nitrogen was blown into the liquid layer for 30 minutes to remove excess ammonia therefrom.

The product obtained was filtered under reduced pressure, in an atmosphere of dry nitrogen and using a Buchner funnel, to obtain 1,200 ml of filtrate. Evaporation of pyridine using an evaporator gave 45 g of polymethylhydropolysilazane.

The weight average molecular weight of the polymethylhydropolysilazane thus obtained was determined by GPC (developing solution: $CHCl_3$), and was found to be 5,000 in terms of polystyrene.

This polymethylhydropolysilazane was coated on the above substrate by the above method and dried. The coating was heated in an oxygen atmosphere (oxygen partial pressure 96 kPa) at a temperature of 800° C. and a water vapor partial pressure of 5 kPa for 1 hour. The determination of etching rate was attempted in the above condition, but it was impossible because nonuniform voids were generated in the inside of the grooves for all aspect ratios.

COMPARATIVE EXAMPLE 4

A four-necked flask with an internal volume of 2 L was equipped with a gas feeding pipe, a mechanical stirrer, and a Dewar condenser. After the content of the reactor was replaced with dry nitrogen, 1,500 ml of dry pyridine was placed in the four-necked flask, which was cooled with ice. Then, 100 g of dichlorosilane was added therein to yield a white solid adduct ($SiH_2Cl_2 \cdot 2C_5H_5N$). While cooling with ice and stirring the reaction mixture, 70 g of ammonia was slowly blown therein. Then dry nitrogen was blown into the liquid layer for 30 minutes to remove excess ammonia therefrom.

The product obtained was filtered under reduced pressure, in an atmosphere of dry nitrogen and using a Buchner funnel, to obtain 1,200 ml of filtrate. Evaporation of pyridine using an evaporator gave 40 g of perhydropolysilazane.

The weight average molecular weight of the perhydropolysilazane thus obtained was determined by GPC (developing solution: $CHCl_3$), and was found to be 1,500 in terms of polystyrene.

This perhydropolysilazane was coated on the above substrate by the above method and dried. The coating was heated in an oxygen atmosphere (oxygen partial pressure 96 kPa) at a temperature of 800° C. and a water vapor partial pressure of 5 kPa for 1 hour. The etching rate was determined using the above method, and etching rates of the inside of the grooves having an aspect ratio of 2.0 or more were all three times or higher than those of the outside of the grooves. The state of the etched interface was smooth for all aspect ratios.

COMPARATIVE EXAMPLE 5

A four-necked flask with an internal volume of 2 L was equipped with a gas feeding pipe, a mechanical stirrer, and a Dewar condenser. After the content of the reactor was replaced with dry nitrogen, 1,500 ml of dry pyridine was placed in the four-necked flask, which was incubated in an oil bath at 60° C. Then, 100 g of dichlorosilane was added therein to yield a white solid adduct ($SiH_2Cl_2 \cdot 2C_5H_5N$). While cooling with ice and stirring the reaction mixture, 70 g of ammonia was slowly blown therein. Then dry nitrogen was blown into the liquid layer for 30 minutes to remove excess ammonia therefrom.

The product obtained was filtered under reduced pressure, in an atmosphere of dry nitrogen and using a Buchner funnel, to obtain 1,200 ml of filtrate. Evaporation of pyridine using an evaporator gave 45 g of perhydropolysilazane.

The weight average molecular weight of the perhydropolysilazane thus obtained was determined by GPC (developing solution; $CHCl_3$), and was found to be 30,000 in terms of polystyrene.

This perhydropolysilazane was coated on the above substrate by the above method and dried. The coating was heated in an oxygen atmosphere (oxygen partial pressure 96 kPa), at a temperature of 800° C. and a water vapor partial pressure of 5 kPa, for 1 hour. In an SEM examination before etching by the above method, circular voids with a diameter of 0.01 to 0.05 μm were observed in the inside of the grooves having an aspect ratio of 2.0 or more.

WORKING EXAMPLE 1

A four-necked flask with an internal volume of 2 L was equipped with a gas feeding pipe, a mechanical stirrer, and a Dewar condenser. After the content of the reactor was replaced with dry nitrogen, 1,500 ml of dry pyridine was placed in the four-necked flask, which was incubated in an oil bath at 20° C. Then, 100 g of dichlorosilane was added therein to yield a white solid adduct ($SiH_2Cl_2 \cdot 2C_5H_5N$). While cooling with ice and stirring the reaction mixture, 70 g of ammonia was slowly blown therein. Then dry nitrogen was blown into the liquid layer for 30 minutes to remove excess ammonia therefrom.

The product obtained was filtered under reduced pressure, in an atmosphere of dry nitrogen and using a Buchner funnel, to obtain 1,200 ml of filtrate. Evaporation of pyridine using an evaporator gave 45 g of perhydropolysilazane.

The weight average molecular weight of the perhydropolysilazane thus obtained was determined by GPC (developing solution: $CHCl_3$), and was found to be 4,000 in terms of polystyrene.

This perhydropolysilazane was coated on the above substrate by the above method and dried. The coating was heated in an oxygen atmosphere (oxygen partial pressure 96 kPa), at a temperature of 800° C. and a water vapor partial pressure of 5 kPa, for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 2

A four-necked flask with an internal volume of 2 L was equipped with a gas feeding pipe, a mechanical stirrer, and a Dewar condenser. After the content of the reactor was replaced with dry nitrogen, 1,500 ml of dry pyridine was placed in the four-necked flask, which was incubated in an oil bath at 40° C. Then, 100 g of dichlorosilane was added therein to yield a white solid adduct ($SiH_2Cl_2 \cdot 2C_5H_5N$). While cooling with ice and stirring the reaction mixture, 70 g of ammonia was slowly blown therein. Then dry nitrogen was blown into the liquid layer for 30 minutes to remove excess ammonia therefrom.

The product obtained was filtered under reduced pressure, in an atmosphere of dry nitrogen and using a Buchner funnel, to obtain 1,200 ml of filtrate. Evaporation of pyridine using an evaporator gave 45 g of perhydropolysilazane.

The weight average molecular weight of the perhydropolysilazane thus obtained was determined by GPC (developing solution: $CHCl_3$), and was found to be 10,000 in terms of polystyrene.

This perhydropolysilazane was coated on the above substrate by the above method and dried. The coating was heated in an oxygen atmosphere (oxygen partial pressure 96 kPa) at a temperature of 800° C. and a water vapor partial pressure of 5 kPa for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 3

Perhydropolysilazane obtained in Working Example 2 was coated on the above substrate by the above method and dried. The coating was heated in an oxygen atmosphere (oxygen partial pressure 96 kPa) at a temperature of 400° C. and a water vapor partial pressure of 5 kPa for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 4

Perhydropolysilazane obtained in Working Example 2 was coated on the above substrate by the above method and dried. The coating was heated in an oxygen atmosphere (oxygen partial pressure 96 kPa) at a temperature of 600° C. and a water vapor partial pressure of 5 kPa for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 5

Perhydropolysilazane obtained in Working Example 2 was coated on the above substrate by the above method and dried. The coating was heated in an oxygen atmosphere (oxygen partial pressure 96 kPa) at a temperature of 1,000° C. and a water vapor partial pressure of 5 kPa for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 6

Perhydropolysilazane obtained in Working Example 2 was coated on the above substrate by the above method and dried. The coating was heated in an oxygen atmosphere (oxygen partial pressure 96 kPa) at a temperature of 1,150° C. and a water vapor partial pressure of 5 kPa for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 7

Perhydropolysilazane obtained in Working Example 2 was coated on the above substrate by the above method and dried. The coating was heated in an oxygen atmosphere (oxygen partial pressure 96 kPa) at a temperature of 700° C. and a water vapor partial pressure of 50 kPa for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 8

Perhydropolysilazane obtained in Working Example 2 was coated on the above substrate by the-above method and dried. The coating was heated in an atmosphere (oxygen partial pressure 96 kPa) at a temperature of 500° C. and a water vapor partial pressure of 5 kPa for 1 hour, and then heated in an oxygen atmosphere (oxygen partial pressure 101 kPa) at a temperature of 600° C. for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 9

Perhydropolysilazane obtained in Working Example 2 was coated on the above substrate by the above method and dried. The coating was heated in an atmosphere at a temperature of 500° C. and a water vapor partial pressure of 5 kPa for 1 hour, and then heated in a nitrogen atmosphere (nitrogen partial pressure 101 kPa) at a temperature of 700° C. for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 10

Perhydropolysilazane obtained in Working Example 2 was coated on the above substrate by the above method and dried. The coating was heated in an atmosphere (oxygen partial pressure 96 kPa) at a temperature of 500° C. and a water vapor partial pressure of 5 kPa for 1 hour, and then heated in a nitrogen atmosphere (nitrogen partial pressure 101 kPa) at a temperature of 1,150° C. for 1 hour. The etching rate was determined using the above method, and for all aspect ratios, etching rates of the inside of the grooves were three times or less those of the outside of the grooves. The state of the etched interface was smooth for all aspect ratios.

WORKING EXAMPLE 11

Perhydropolysilazane obtained in Working Example 2 was coated on the above substrate by the above method and dried. To convert the coating to a siliceous material coating, it was heated in an atmosphere (oxygen partial pressure 96 kPa) at a temperature of 500° C. and a water vapor partial pressure of 5 kPa for 1 hour, and then heated under vacuum of about 1.33 Pa (0.01 Torr) at a temperature of 700° C. for 1 hour. The etching rate was determined using the above method, and for all aspect ratios, etching rates of the inside of the grooves were three times or less those of the outside of the grooves. The state of the etched interface was smooth for all aspect ratios.

The results of Comparative Examples (1 to 5) and Working Examples (1 to 11) are summarized in Table 1.

| Example No. | Etching rate on the outside of the groove (A/min) | Etching rate in the inside of the groove/etching rate on the outside of the groove | | | | Etched surface (inside of the groove after etching) | | | |
|---|---|---|---|---|---|---|---|---|---|
| | | 0.08 μm (5.0) | 0.1 μm (4.0) | 0.2 μm (2.0) | 0.4 μm (1.0) | 0.08 μm (5.0) | 0.1 μm (4.0) | 0.2 μm (2.0) | 0.4 μm (1.0) |
| Work. Ex. 1 | 140 | 1.5 | 1.2 | 1.2 | 1.1 | Smooth | Smooth | Smooth | Smooth |
| Work. Ex. 2 | 120 | 1.4 | 1.2 | 1.1 | 1.1 | Smooth | Smooth | Smooth | Smooth |
| Work. Ex. 3 | 1800 | 1.2 | 1.1 | 1.1 | 1.1 | Smooth | Smooth | Smooth | Smooth |
| Work. Ex. 4 | 400 | 2.2 | 1.8 | 1.5 | 1.4 | Smooth | Smooth | Smooth | Smooth |
| Work. Ex. 5 | 70 | 1.3 | 1.2 | 1.1 | 1.1 | Smooth | Smooth | Smooth | Smooth |
| Work. Ex. 6 | 70 | 1.2 | 1.2 | 1.1 | 1.1 | Smooth | Smooth | Smooth | Smooth |
| Work. Ex. 7 | 120 | 1.4 | 1.2 | 1.1 | 1.1 | Smooth | Smooth | Smooth | Smooth |

-continued

| Example No. | Etching rate on the outside of the groove (A/min) | Etching rate in the inside of the groove/etching rate on the outside of the groove | | | | Etched surface (inside of the groove after etching) | | | |
| --- | --- | --- | --- | --- | --- | --- | --- | --- | --- |
| | | 0.08 µm (5.0) | 0.1 µm (4.0) | 0.2 µm (2.0) | 0.4 µm (1.0) | 0.08 µm (5.0) | 0.1 µm (4.0) | 0.2 µm (2.0) | 0.4 µm (1.0) |
| Work. Ex. 8 | 550 | 2.5 | 2.0 | 1.6 | 1.6 | Smooth | Smooth | Smooth | Smooth |
| Work. Ex. 9 | 450 | 2.3 | 1.9 | 1.5 | 1.3 | Smooth | Smooth | Smooth | Smooth |
| Work. Ex. 10 | 180 | 1.6 | 1.4 | 1.1 | 1.1 | Smooth | Smooth | Smooth | Smooth |
| Work. Ex. 11 | 480 | 2.2 | 2.0 | 1.5 | 1.4 | Smooth | Smooth | Smooth | Smooth |
| Com. Ex. 1 | 4000 | Unmeasurable | Unmeasurable | Unmeasurable | Unmeasurable | Cavitated | Cavitated | Cavitated | Cavitated |
| Com. Ex. 2 | 180 | Unmeasurable | Unmeasurable | Unmeasurable | 8.5 | Cavitated | Cavitated | Cavitated | Cavitated |
| Com. Ex. 3 | 450 | Unmeasurable | Unmeasurable | Unmeasurable | Unmeasurable | Cavitated | Cavitated | Cavitated | Cavitated |
| Com. Ex. 4 | 160 | 5.5 | 4.2 | 3.1 | 1.8 | Smooth | Smooth | Smooth | Smooth |
| Com. Ex. 5 | 120 | Unmeasurable | Unmeasurable | Unmeasurable | 1.2 | Void | Void | Void | Void |

* For example, 0.08 µm (5.0) means a groove width of 0.08 µm and an aspect ratio of 5.0.

From the above results, it can be seen that, in the siliceous material coating (Working Examples 1 to 11) obtained by the method of the present invention, the ratio of the etching rate in the inside of the groove/the etching rate in the outside of the groove is 3 or less over the range of aspect ratios of 1 to 5, and that the difference in density of grooves of the sealed material between the inside and the outside is smaller than in Comparative Example 4 in which this ratio was maximum at 5.5 and than in other Comparative Examples in which there were voids and cavities.

Also, among a plurality of fine grooves with different groove widths (grooves with an aspect ratio 1 and 5), the difference in density is a factor of about 1.6 at the maximum (Working Example 4, 11) in the siliceous material coating of the present invention, whereas a difference of three times or more was noted in Comparative Example 4.

Furthermore, it can be seen from the present invention that the difference in density between the inside and the outside of grooves is not associated with the degree of density of siliceous material coating. For example, in comparison of Working Example 3 with working Example 6, the ratio of etching rate of the inside and the outside of the grooves is almost the same, but from the etching rate value at the outside of the grooves, it is apparent that the siliceous material coating of Working Example 6 is about 26 times more dense than that of Working Example 3. Thus, according to the present invention, the formation of low density siliceous material coating or the formation of high density siliceous material coating does not affect the difference between the inside and the outside of fine grooves.

INDUSTRIAL APPLICABILITY

According to the present invention, fine grooves having a width of 0.2 µm or less at the deepest portions and the ratio of the corresponding depths to widths of 2 or more can be more uniformly sealed with siliceous material in terms of density regardless of the inside or the outside, or width of the grooves.

What is claimed is:

1. A method for sealing a fine groove with a siliceous material, characterized as comprising applying a solution of a perhydropolysilazane having a weight average molecular weight in the range of 3,000 to 20,000 in terms of polystyrene to a substrate having at least one groove having a width of 0.2 µm or less at its deepest portion and having a ratio of the corresponding depth to the width of 2 or more, to thereby fill and seal the groove with the perhydropolysilazane, and then heating the perhydropolysilazane in an atmosphere containing water vapor to thereby convert the perhydropolysilazane to the siliceous material.

2. A method according to claim 1 wherein a partial pressure of water vapor in said atmosphere is in the range of 0.5 to 101 kPa.

3. A method according to claim 1 wherein said heating is carried out at a temperature in the range of 400 to 1200° C.

4. A method according to claim 1 wherein said heating is carried out in an atmosphere at a temperature in the range of 400 to 600° C. and a water vapor partial pressure in the range of 0.5 to 101 kPa, followed by heating in an atmosphere at a temperature in the range of 500 to 1,200° C. and an oxygen partial pressure in the range of 0.5 to 101 kPa.

5. A method according to claim 1 wherein said heating is carried out in an atmosphere at a temperature in the range of 400 to 600° C. and a water vapor partial pressure in the range of 0.5 to 101 kPa, followed by heating in an atmosphere of one or more of an inert gas selected from nitrogen, helium, and argon at a temperature in the range of 500 to 1,200° C.

6. A method according to claim 1 wherein said heating is carried out in an atmosphere at a temperature in the range of 400 to 600° C. and a water vapor partial pressure in the range of 0.5 to 101 kPa, followed by heating in an atmosphere with a reduced pressure of less than 1.0 kPa or a vacuum at a temperature in the range of 500 to 1,200° C.

7. A substrate having siliceous coating formed thereon comprising a substrate containing at least one groove having a width of 0.2 µm or less at its deepest portion and having the ratio of the corresponding depth to the width of 2 or more and a siliceous coating formed thereon to fill and seal said groove, wherein said siliceous material coating is formed by applying a solution of a perhydropolysilazane having a weight average molecular weight in the range of 3,000 to 20,000 in terms of polystyrene and then heating the perhydropolysilazane in an atmosphere containing water vapor to convert the perhydropolysilazane to said siliceous material coating and said siliceous material coating is substantially free of voids in the inside of the groove, and the etching rate in said groove at its deepest portion is at most three times the etching rate on the surface of said siliceous material coating.

8. A substrate having siliceous coating formed thereon according to claim 7 wherein said groove has a width at its most deep portion of 0.1 µm or less, and has a ratio of the depth to its width of 4 or more.

9. A substrate having siliceous coating formed thereon according to claim 7 wherein the etching rate at the deepest portion in said groove is at most twice the etching rate on the surface of said siliceous material coating.

10. A substrate having siliceous coating formed thereon according to claim 7 wherein said siliceous material coating contains nitrogen in the range of 0.005 to 5% in terms of atomic percentage.

11. A substrate having siliceous coating formed thereon according to claim 7 wherein a partial pressure of water vapor in said atmosphere is in the range of 0.5 to 101 kPa.

12. A substrate having siliceous coating formed thereon according to claim 7 wherein said heating is carried out at a temperature in the range of 400 to 1200° C.

13. A substrate having siliceous coating formed thereon according to claim 7 wherein said heating is carded out in an atmosphere at a temperature in the range of 400 to 600° C. and a water vapor partial pressure in the range of 0.5 to 101 kPa, followed by heating in an atmosphere at a temperature in the range of 500 to 1,200° C. and an oxygen partial pressure in the range of 0.5 to 101 kPa.

14. A substrate having siliceous coating formed thereon according to claim 7 wherein said heating is carried out in an atmosphere at a temperature in the range of 400 to 600° C. and a water vapor partial pressure in the range of 0.5 to 101 kPa, followed by heating in an atmosphere of one or more of an inert gas selected from nitrogen, helium, and argon at a temperature in the range of 500 to 1,200° C.

15. A substrate having siliceous coating formed thereon according to claim 7 wherein said heating is carried out in an atmosphere at a temperature in the range of 400 to 600° C. and a water vapor partial pressure in the range of 0.5 to 101 kPa, followed by heating in an atmosphere with a reduced pressure of less than 1.0 kPa or a vacuum at a temperature in the range of 500 to 1,200° C.

* * * * *